United States Patent
Shiokawa et al.

(10) Patent No.: US 11,139,340 B2
(45) Date of Patent: Oct. 5, 2021

(54) SPIN ELEMENT AND RESERVOIR ELEMENT

(71) Applicant: TDK CORPORATION, Tokyo (JP)

(72) Inventors: Yohei Shiokawa, Tokyo (JP); Atsushi Tsumita, Tokyo (JP)

(73) Assignee: TDK CORPORATION, Tokyo (JP)

( * ) Notice: Subject to any disclaimer, the term of this patent is extended or adjusted under 35 U.S.C. 154(b) by 59 days.

(21) Appl. No.: 16/788,419

(22) Filed: Feb. 12, 2020

(65) Prior Publication Data

US 2021/0249470 A1   Aug. 12, 2021

(51) Int. Cl.
| | |
|---|---|
| H01L 27/22 | (2006.01) |
| G11C 11/16 | (2006.01) |
| H01L 23/528 | (2006.01) |
| H01L 43/02 | (2006.01) |

(52) U.S. Cl.
CPC .......... *H01L 27/222* (2013.01); *G11C 11/161* (2013.01); *H01L 23/528* (2013.01); *H01L 43/02* (2013.01)

(58) Field of Classification Search
CPC ...... H01L 27/222; H01L 23/528; H01L 43/02
See application file for complete search history.

(56) References Cited

U.S. PATENT DOCUMENTS

| | | | |
|---|---|---|---|
| 8,350,347 B2 | 1/2013 | Gaudin et al. | |
| 2011/0129691 A1 | 6/2011 | Ishiwata et al. | |
| 2015/0348606 A1* | 12/2015 | Buhrman | G11C 11/1675 365/158 |
| 2017/0222135 A1* | 8/2017 | Fukami | H01L 27/228 |

FOREIGN PATENT DOCUMENTS

| | | |
|---|---|---|
| JP | 5441005 B2 | 3/2014 |
| JP | 2017-216286 A | 12/2017 |
| WO | 2016/021468 A1 | 2/2016 |

OTHER PUBLICATIONS

Y.K. Kato et al. "Observation of the Spin Hall Effect in Semiconductors". Science Magazine, vol. 306, Dec. 10, 2004, pp. 1910-1913.

Ioan Mihai Miron et al. "Perpendicular Switching of a Single Ferromagnetic Layer Induced by In-Plane Current Injection". Nature, vol. 476, Aug. 11, 2011, pp. 189-194.

(Continued)

*Primary Examiner* — Marc Anthony Armand
(74) *Attorney, Agent, or Firm* — Oliff PLC

(57) ABSTRACT

A magnetic recording array includes: a plurality of spin elements each including a wiring and a laminated body having a first ferromagnetic layer laminated on the wiring and arranged in a matrix; a plurality of write wirings connected to first ends of the spin elements' wiring; a plurality of read wirings connected to the laminated bodies of the spin elements; a plurality of common wirings connected to second ends of the wirings of the spin elements belonging to the same column; and a control unit configured to control a write current flowing between first and second ends of each spin element, wherein when data writing is performed continuously, the unit is configured to prohibit writing to at least a spin element connected to the same common wiring as a first spin element and adjacent to the first spin element after the first element to which the current is applied.

10 Claims, 7 Drawing Sheets

(56) References Cited

OTHER PUBLICATIONS

Luqiao Liu et al. "Spin Torque Switching With the Giant Spin Hall Effect of Tantalum". Science Magazine, vol. 336, Mar. 13, 2012, pp. 555.
Luqiao Liu et al. "Current-Induced Switching of Perpendicularly Magnetized Magnetic Layers Using Spin Torque From the Spin Hall Effect". Physical Review Letters, vol. 109, Aug. 31, 2012, pp. 096602-1 through 096602-5.
Ki-Seung Lee et al. "Threshold Current for Switching of a Perpendicular Magnetic Layer Induced by Spin Hall Effect". Applied Physics Letters, vol. 102, 2013, pp. 112410-1 through 112410-5.
Ki-Seung Lee et al. "Thermally Activated Switching of Perpendicular Magnet by Spin-Orbit Spin Torque". Applied Physics Letters, vol. 104, 2014, pp. 072413-1 through 072413-5.
Shunsuke Fukami et al. "Magnetization Switching by Spin-Orbit Torque in an Antiferromagnet-Ferromagnet Bilayer System". Nature Materials, vol. 15, May 2016, pp. 535-542.
S. Fukami et al. "A Spin-Orbit Torque Switching Scheme With Collinear Magnetic Easy Axis and Current Configuration". Nature Nanotechnology, Mar. 21, 2016, pp. 1-6.
S. Takahashi et al. "Spin Injection and Detection in Magnetic Nanostructures". Physical Review B, vol. 67, 2003, pp. 052409-1 through 052409-4.
Yeongkyo Seo et al. "Area-Efficient SOT-MRAM With a Schottky Diode". IEEE Electron Device Letters, vol. 37, No. 8, Aug. 2016, pp. 982-985.
Wei Zhang et al. "Spin Hall Effects in Metallic Antiferromagnets". Physical Review Letters, vol. 113, Nov. 7, 2014, pp. 196602-1 through 196602-6.

\* cited by examiner

SPIN ELEMENT AND RESERVOIR ELEMENT

TECHNICAL FIELD

The present invention relates to a spin element and a reservoir element.

BACKGROUND ART

Next-generation non-volatile memories which will replace flash memories having a limit in miniaturization have been gaining attention. For example, an MRAM (Magnetoresistive Random Access Memory), a ReRAM (Resistance Random Access Memory), a PCRAM (Phase Change Random Access Memory), and the like are known as next-generation non-volatile memories.

The MRAM is a memory element that uses a magnetoresistance effect element. The resistance value of the magnetoresistance effect element changes depending on the difference in relative angle of the magnetization directions of two magnetic films. The MRAM records the resistance value of the magnetoresistance effect element as data.

Among the spin elements using a change in magnetoresistance, a spin-orbit-torque type magnetoresistance effect element using a spin orbit torque (SOT) (for example, Patent Document 1) and a magnetic domain wall displacement type magnetic recording element using domain wall movement (for example, see Patent Document 2) have been gaining attention.

CITATION LIST

Patent Literature

[Patent Document 1] Japanese Unexamined Patent Application, First Publication No. 2017-216286
[Patent Document 2] Japanese Patent No. 5441005

SUMMARY OF INVENTION

Technical Problem

When recording data in the spin element, a write current is applied to the spin element. When the write current is applied to the spin element, the spin element generates heat. The heat generated in the spin element causes data writing failure and the like.

The present invention has been made in view of the above-described problems and an object of the present invention is to provide a magnetic recording array contrived in consideration of heat during writing.

Solution to Problem (1) A magnetic recording array according to a first aspect includes: a plurality of spin elements each of which includes a wiring and a laminated body having a first ferromagnetic layer laminated on the wiring and which are arranged in a matrix; a plurality of write wirings which are respectively connected to first ends of the wirings of the plurality of spin elements; a plurality of read wirings which are respectively connected to the laminated bodies of the plurality of spin elements; a plurality of common wirings which are respectively connected to second ends of the wirings of the spin elements belonging to the same column; and a control unit which is configured to control a write current flowing through the wiring of each spin element, wherein when data writing is performed continuously, the control unit is configured to prohibit writing to at least a spin element connected to the same common wiring as a first spin element and adjacent to the first spin element after the first spin element to which the write current is applied.

(2) In the magnetic recording array according to the above-described aspect, when data writing is performed continuously, the control unit may prohibit writing to the spin elements connected to the same common wiring as the first spin element after the first spin element to which the write current is applied.

(3) In the magnetic recording array according to the above-described aspect, the wiring may have a thermal conductivity of 200 W/mK or less at 0° C.

(4) In the magnetic recording array according to the above-described aspect, the laminated body may include the first ferromagnetic layer and the wiring may be of any one of a metal, an alloy, an intermetallic compound, a metal boride, a metal carbide, a metal silicide, and a metal phosphide having a function of generating a spin current by a spin Hall effect when a current flows.

(5) In the magnetic recording array according to the above-described aspect, the laminated body may include the first ferromagnetic layer, the non-magnetic layer, and the second ferromagnetic layer from a position near the wiring and the wiring may be of any one of a metal, an alloy, an intermetallic compound, a metal boride, a metal carbide, a metal silicide, and a metal phosphide having a function of generating a spin current by a spin Hall effect when a current flows.

(6) In the magnetic recording array according to the above-described aspect, the wiring may contain at least one selected from a group consisting of W, Ta, Pt, Mo, Ir, Zr, Re, Y, Os, Ru, Rh, Pd, and Mn.

(7) In the magnetic recording array according to the above-described aspect, the laminated body may include a non-magnetic layer and the first ferromagnetic layer from a position near the wiring and the wiring may be a ferromagnetic layer having a magnetic domain wall provided therein.

(8) A reservoir element according to a second aspect includes: the magnetic recording array according to the above-described aspect; and a spin conduction layer which is configured to connect the first ferromagnetic layers of the plurality of spin elements.

Advantage of the Invention

In the spin element and the reservoir element according to the above-described aspect, local heat generation can be suppressed.

DESCRIPTION OF EMBODIMENTS

Figure 1:
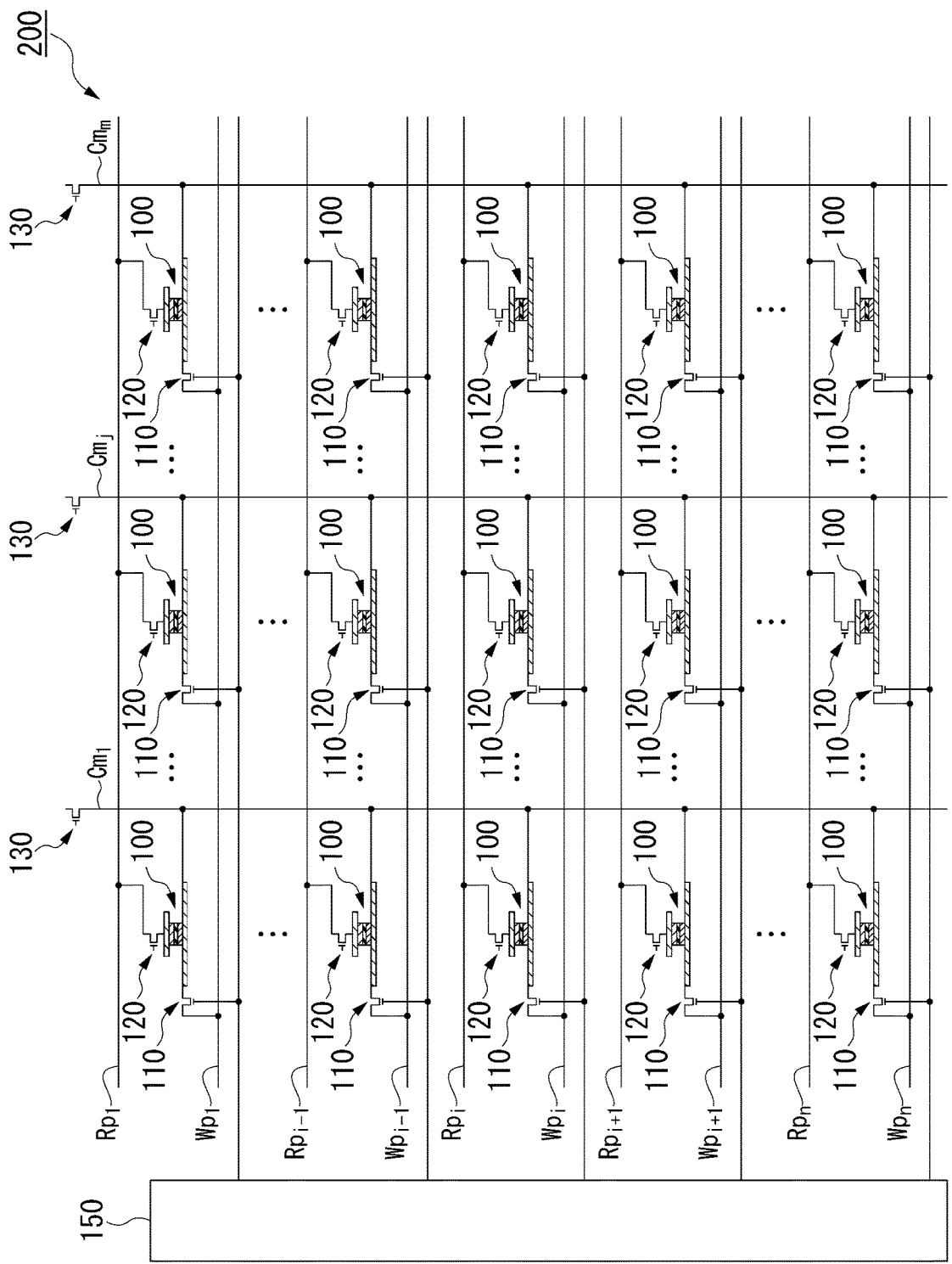
FIG. 1 is a schematic view of a magnetic recording array according to a first embodiment.

Hereinafter, preferred examples of the present invention will be described in detail by appropriately referring to the drawings. In the drawings used in the following description, characteristic parts are enlarged for convenience of description in order to easily understand the characteristics of the present invention and hence the dimensional ratio of each component may be different from the actual one. The materials, dimensions, and the like in the following description are merely exemplary examples and the present invention is not limited thereto and can be implemented with appropriate modifications within a range in which the effects of the present invention are exhibited.

First, directions will be defined. One direction of one surface of a substrate Sub (see FIG. 2) to be described later is an x direction and a direction orthogonal to the x direction is a y direction. The x direction is a direction in which wirings 20 and 21 to be described later extend and is a longitudinal direction of the wirings 20 and 21. The x direction is an example of a first direction. The y direction is an example of a second direction. A z direction is a direction orthogonal to the x direction and the y direction. The z direction is an example of a laminating direction. Hereinafter, the +z direction may be expressed as "up" and the −z direction may be expressed as "down". Up and down do not always match a direction in which gravity applies.

First Embodiment

FIG. 1 is a configuration diagram of a magnetic recording array 200 according to a first embodiment. The magnetic recording array 200 includes a plurality of magnetoresistance effect elements 100, a plurality of write wirings $Wp_1$ to $Wp_n$, a plurality of common wirings $Cm_1$ to $Cm_n$, a plurality of read wirings $Rp_1$ to $Rp_n$, a plurality of switching elements 110, 120, and 130, and a control unit 150. The magnetic recording array 200 can be used in, for example, a magnetic memory or the like. The magnetoresistance effect element 100 is an example of a spin element.

The plurality of magnetoresistance effect elements 100 shown in FIG. 1 are arranged in a matrix of n rows and m columns. n and m are arbitrary integers. Here, the term "matrix" is not necessarily limited to a case in which actual elements are arranged in a matrix, and includes those that can be described using a matrix in a circuit diagram.

The write wirings $Wp_1$ to $Wp_n$ are wirings connected to first ends of wirings to be described later in the magnetoresistance effect elements 100. The write wirings $Wp_1$ to $Wp_n$ are used, for example, when writing data. There are n number of the write wirings $Wp_1$ to $Wp_n$ shown in FIG. 1. The write wirings $Wp_1$ to $Wp_n$ electrically connect a power supply (not shown) to one or more magnetoresistance effect elements 100. The write wirings $Wp_1$ to $Wp_n$ shown in FIG. 1 electrically connect a power supply (not shown) to the magnetoresistance effect elements 100 belonging to the same row. The write wirings $Wp_1$ to $Wp_n$ may be individually and respectively connected to the magnetoresistance effect elements 100 or may be connected across the magnetoresistance effect elements 100 belonging to the same column.

The read wirings $Rp_1$ to $Rp_n$ are wirings connected to laminated bodies to be described later in the magnetoresistance effect elements 100. The read wirings $Rp_1$ to $Rp_n$ are wirings used, for example, when reading data. There are n number of the read wirings $Rp_1$ to $Rp_n$ shown in FIG. 1. The read wirings $Rp_1$ to $Rp_n$ electrically connect a power supply (not shown) to one or more magnetoresistance effect elements 100. The read wirings $Rp_1$ to $Rp_n$ shown in FIG. 1 electrically connect a power supply (not shown) to the magnetoresistance effect elements 100 belonging to the same row. The read wirings $Rp_1$ to $Rp_n$ may be individually and respectively connected to the magnetoresistance effect elements 100 or may be connected across the magnetoresistance effect elements 100 belonging to the same column.

The common wirings $Cm_1$ to $Cm_m$ are wirings connected to second ends of wirings to be described later in the magnetoresistance effect elements 100. The common wirings $Cm_1$ to $Cm_m$ are wirings used, for example, when writing and reading data. There are m number of the common wirings $Cm_1$ to $Cm_m$ shown in FIG. 1. The common wirings $Cm_1$ to $Cm_m$ electrically connect a reference potential to the magnetoresistance effect elements 100 belonging to the same column. The reference potential is, for example, a ground.

The switching element 110 is between each magnetoresistance effect element 100 and each of the write wirings $Wp_1$ to $Wp_n$. The switching element 120 is between each magnetoresistance effect element 100 and each of the read wirings $Rp_1$ to $Rp_n$. The switching element 130 is in each of the common wirings $Cm_1$ to $Cm_m$. The magnetoresistance effect elements 100 belonging to the same column are connected to one switching element 130 and the magnetoresistance effect elements 100 belonging to the same column share the switching element 130.

Each magnetoresistance effect element 100 is electrically connected to three switching elements 110, 120, and 130 controlling an operation. An element whose operation is controlled by three switching elements is called a three-terminal element. When the switching elements 110 and 130 are turned on, a write current flows to a predetermined magnetoresistance effect element 100. When the switching elements 120 and 130 are turned on, a read current flows to a predetermined magnetoresistance effect element 100.

The switching elements 110, 120, and 130 are elements that control a flow of a current. Each of the switching elements 110, 120, and 130 is, for example, a transistor, an element using a phase change of a crystal layer such as an ovonic threshold switch (OTS), an element using a change in a band structure such as a metal-insulator transition (MIT) switch, an element using a breakdown voltage such as a Zener diode and an avalanche diode, or an element whose conductivity changes with a change in an atomic position.

FIG. 1 shows an example in which the magnetoresistance effect elements 100 belonging to the same column share the switching element 130, but the switching element 130 may be disposed between the magnetoresistance effect element 100 and each of the common wirings $Cm_1$ to $Cm_m$. Further, when the plurality of magnetoresistance effect elements 100 do not share the switching element 130, the switching element 110 may not be disposed between the magnetoresistance effect element 100 and each of the write wirings $Wp_1$ to $Wp_n$ and the magnetoresistance effect elements 100 belonging to the same row may share the switching element 110. Similarly, the switching element 120 may not be disposed between the magnetoresistance effect element 100 and each of the read wirings $Rp_1$ to $Rp_n$ and the magnetoresistance effect elements 100 belonging to the same row may share the switching element 120.

The control unit 150 is electrically connected to each magnetoresistance effect element 100. The control unit 150 controls a write current flowing in each magnetoresistance effect element 100. The control unit 150 is connected to, for example, each switching element 110 and controls an ON/OFF state of the switching element 110. The control unit 150 will be described later in detail.

Figure 2:
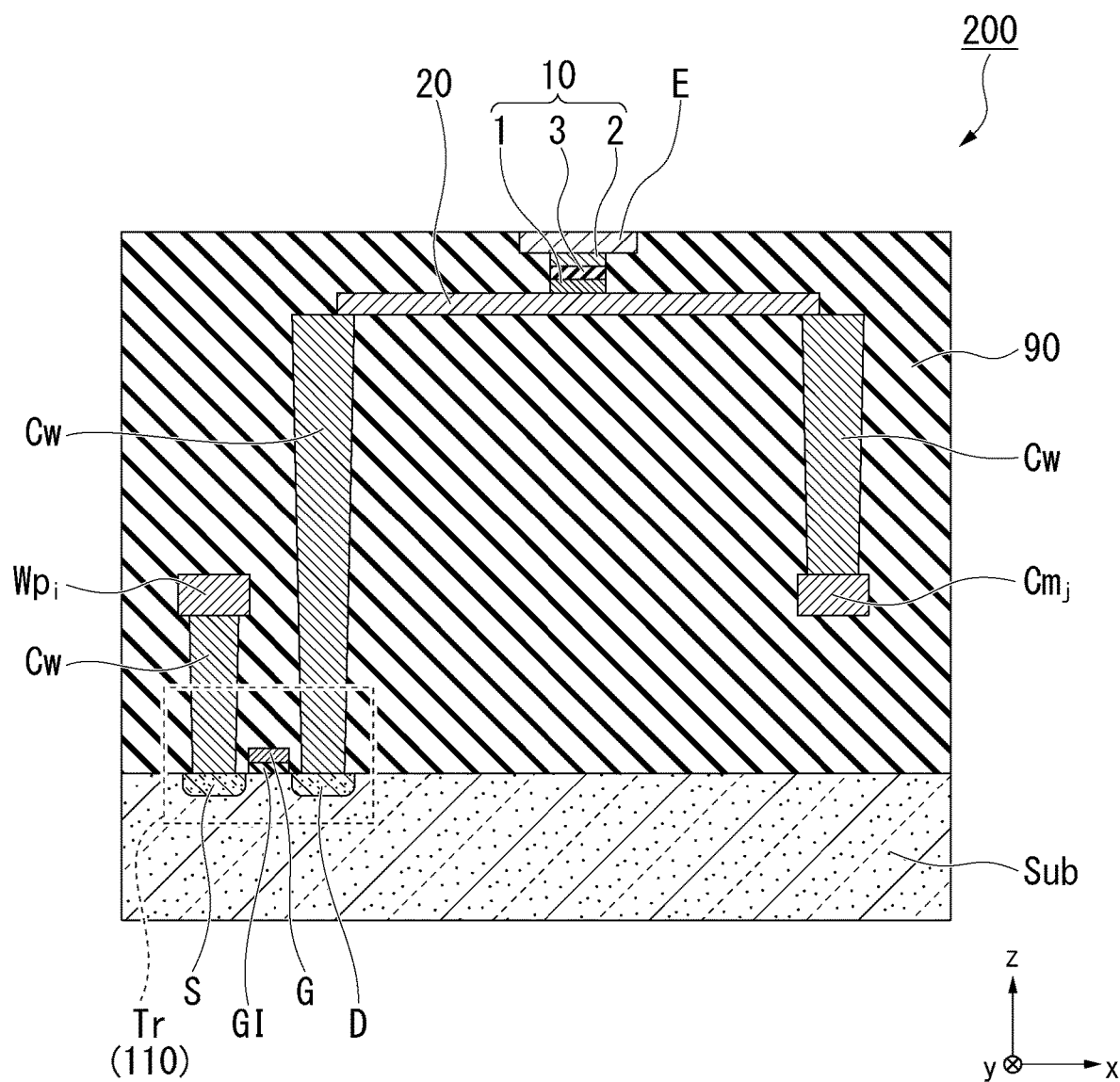
FIG. 2 is a cross-sectional view of characteristic parts of the magnetic recording array according to the first embodiment.

FIG. 2 is a cross-sectional view of the magnetic recording array 200 according to the first embodiment. FIG. 2 shows a cross-section in which the magnetoresistance effect element 100 at the i-th row and the j-th column is cut along the xz plane passing through the center of the width of the wiring 20 in the y direction described later.

The switching element 110 shown in FIG. 2 is a transistor Tr. The switching element 120 is electrically connected to a conductive layer E and is located, for example, in the y direction of FIG. 2. The switching element 130 is electrically connected to the common wiring $Cm_j$ and is located, for example, in the y direction of FIG. 2. The write wiring $Wp_i$ is connected to the first end of the wiring 20 via the connection wiring Cw and the switching element 110. The common wiring $Cm_j$ is connected to the second end of the wiring 20 via the connection wiring Cw. The read wiring $Rp_j$ is connected to a first ferromagnetic layer 1 of a laminated body 10 via the conductive layer E.

The transistor Tr is, for example, a field-effect transistor and includes a gate electrode G, a gate insulating film GI, and a source S and a drain D formed on the substrate Sub. The substrate Sub is, for example, a semiconductor substrate.

The connection wiring Cw electrically connects different layers in the z direction. The connection wiring Cw may be called, for example, a via wiring. The connection wiring Cw extends in, for example, the z direction. The connection wiring Cw is formed of a material having excellent conductivity. For example, the connection wiring Cw has better conductivity than the wiring 20.

The periphery of the magnetoresistance effect element 100 and the transistor Tr is covered with an insulating layer 90. The insulating layer 90 is an interlayer insulating film that insulates between multi-layer wirings and between elements. The insulating layer 90 is formed of, for example, silicon oxide ($SiO_x$), silicon nitride ($SiN_x$), silicon carbide (SiC), chromium nitride, silicon carbonitride (SiCN), silicon oxynitride (SiON), aluminum oxide ($Al_2O_3$), zirconium oxide ($ZrO_x$), and the like.

Figure 3:
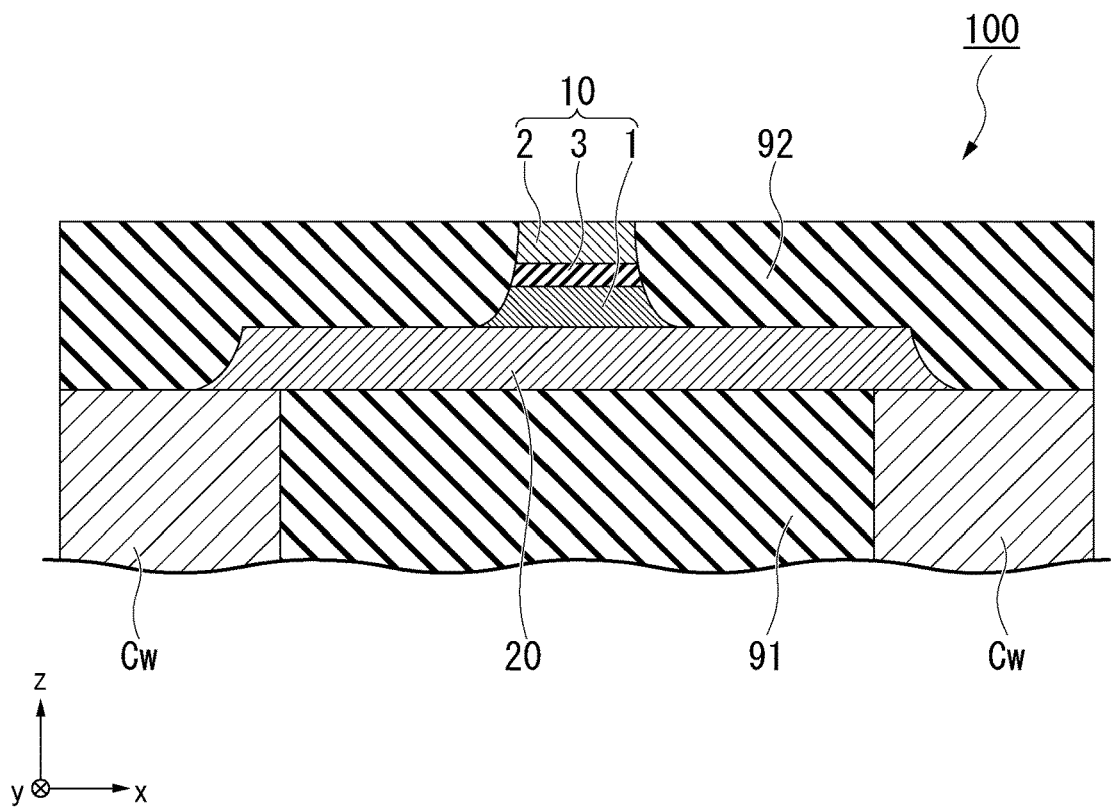
FIG. 3 is a cross-sectional view of a spin element according to the first embodiment.
Figure 4:
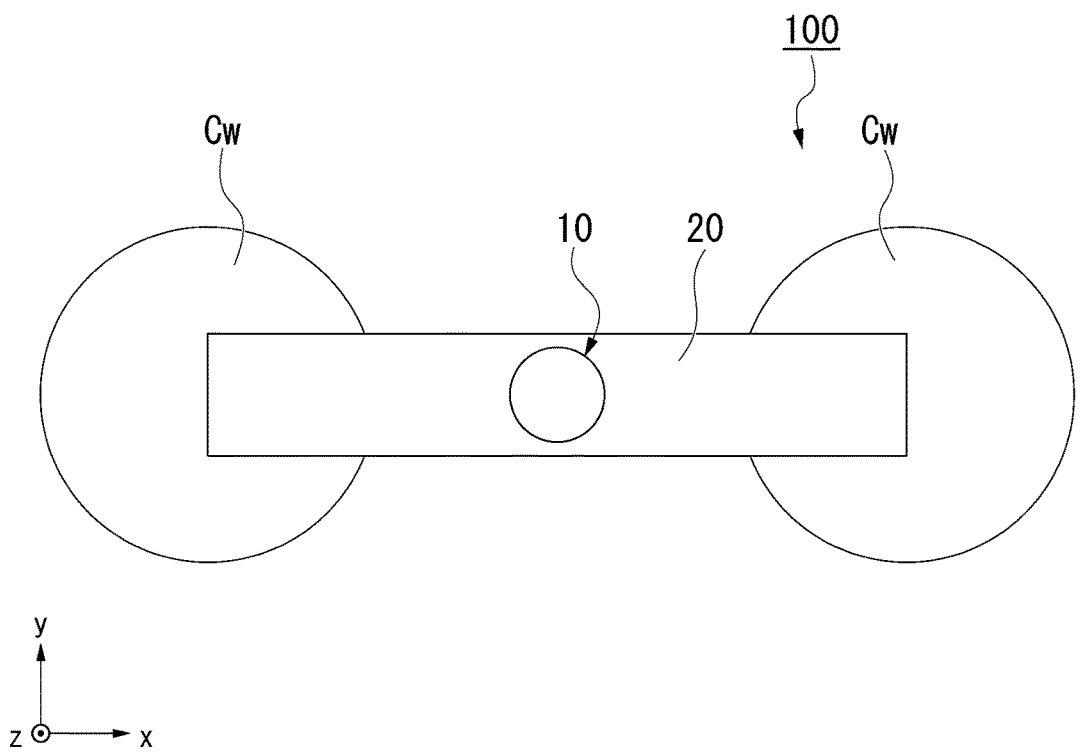
FIG. 4 is a plan view of the spin element according to the first embodiment.

FIG. 3 is a cross-sectional view of the magnetoresistance effect element 100 according to the first embodiment. FIG. 4 is a plan view of the magnetoresistance effect element 100 according to the first embodiment. FIG. 3 shows a cross-section in which the magnetoresistance effect element 100 is cut along an xz plane passing through the center of the width of the wiring 20 in the y direction.

The magnetoresistance effect element 100 includes the laminated body 10 and the wiring 20. An insulating layer 91 and an insulating layer 92 are a part of the insulating layer 90. A resistance value of the laminated body 10 in the z direction changes by injecting spins from the wiring 20 to the laminated body 10. The magnetoresistance effect element 100 is a spin element that uses a spin orbit torque (SOT) and may be called a spin-orbit-torque type magnetoresistance effect element, a spin injection type magnetoresistance effect element, and a spin current magnetoresistance effect element. Further, the wiring 20 may be called a spin-orbit-torque wiring.

The laminated body 10 is laminated on the wiring 20. Another layer may be disposed between the laminated body 10 and the wiring 20. The laminated body 10 is sandwiched between the wiring 20 and the conductive layer E in the z direction. The laminated body 10 is electrically connected to the read wiring. The laminated body 10 is a columnar body. The planar shape of the laminated body 10 in the z direction is, for example, a circle, an ellipse, or a square.

The laminated body 10 includes the first ferromagnetic layer 1, a second ferromagnetic layer 2, and a non-magnetic layer 3. The first ferromagnetic layer 1 is in contact with, for example, the wiring 20 and is laminated on the wiring 20. Spins are injected from the wiring 20 to the first ferromagnetic layer 1. The orientation direction of the magnetization of the first ferromagnetic layer 1 changes by receiving the spin orbit torque (SOT) due to the injected spins. The second ferromagnetic layer 2 is in the z direction of the first ferromagnetic layer 1. The first ferromagnetic layer 1 and the second ferromagnetic layer 2 sandwich the non-magnetic layer 3 in the z direction.

Each of the first ferromagnetic layer 1 and the second ferromagnetic layer 2 has magnetization. The orientation direction of the magnetization of the second ferromagnetic layer 2 is not easily changed as compared with the magnetization of the first ferromagnetic layer 1 when a predetermined external force is applied. The first ferromagnetic layer 1 may be called a magnetization free layer and the second ferromagnetic layer 2 may be called a magnetization fixed layer and a magnetization reference layer. The resistance value of the laminated body 10 changes in response to a difference in relative magnetization angle of the first ferromagnetic layer 1 and the second ferromagnetic layer 2 interposing the non-magnetic layer 3.

The first ferromagnetic layer 1 and the second ferromagnetic layer 2 contain a ferromagnetic material. The ferromagnetic material is, for example, a metal selected from a group consisting of Cr, Mn, Co, Fe, and Ni, an alloy containing one or more of these metals, an alloy containing these metals and at least one element of B, C, and N, or the like. The ferromagnetic material is, for example, Co—Fe, Co—Fe—B, Ni—Fe, a Co—Ho alloy, a Sm—Fe alloy, a Fe—Pt alloy, a Co—Pt alloy, or a CoCrPt alloy.

The first ferromagnetic layer 1 and the second ferromagnetic layer 2 may contain a Heusler alloy. The Heusler alloy contains an intermetallic compound with a chemical composition of XYZ or $X_2YZ$. X represents a transition metal element or a noble metal element of the Co, Fe, Ni, or Cu group on the periodic table, Y represents a transition metal of the Mn, V, Cr or Ti group or an element type of X, and Z represents a typical element of Group III to Group V. Examples of the Heusler alloys include, for example, $Co_2FeSi$, $Co_2FeGe$, $Co_2FeGa$, $Co_2MnSi$, $Co_2Mn_{1-a}Fe_aAl_bSi_{1-b}$, $Co_2FeGe_{1-c}Ga_c$, and the like. Heusler alloys have high spin polarization.

The laminated body 10 may have an antiferromagnetic layer on the surface of the second ferromagnetic layer 2 opposite to the non-magnetic layer 3 with a spacer layer therebetween. The second ferromagnetic layer 2, the spacer layer, and the antiferromagnetic layer have a synthetic antiferromagnetic structure (SAF structure). The synthetic antiferromagnetic structure includes two magnetic layers sandwiching a non-magnetic layer. Due to the antiferromagnetic coupling between the second ferromagnetic layer 2 and the antiferromagnetic layer, the coercivity of the second ferromagnetic layer 2 becomes larger than one without the antiferromagnetic layer. The antiferromagnetic layer is, for example, IrMn, PtMn, or the like. The spacer layer contains, for example, at least one selected from a group consisting of Ru, Ir, and Rh.

The laminated body 10 may include a layer other than the first ferromagnetic layer 1, the second ferromagnetic layer 2, and the non-magnetic layer 3. For example, an underlayer may be disposed between the wiring 20 and the laminated body 10. The underlayer enhances the crystallinity of each layer constituting the laminated body 10.

The wiring 20 is in contact with, for example, one surface of the laminated body 10. The wiring 20 is a write wiring for writing data to the magnetoresistance effect element 100. The first end of the wiring 20 is connected to the write wiring $Wp_i$ through the connection wiring Cw and the switching element 110. The second end of the wiring 20 is connected to the common wiring $Cm_j$ through the connection wiring Cw. The wiring 20 extends in the x direction. At least a part of the wiring 20 sandwiches the first ferromagnetic layer 1 along with the non-magnetic layer 3 in the z direction.

The wiring 20 generates a spin current by a spin Hall effect when a current flows and injects spins into the first ferromagnetic layer 1. The wiring 20 applies, for example, a spin orbit torque (SOT) capable of reversing the magnetization of the first ferromagnetic layer 1 to the magnetization of the first ferromagnetic layer 1. The spin Hall effect is a phenomenon in which a spin current is induced in a direction perpendicular to the direction of current flow based on the spin-orbit interaction when a current flows. The spin Hall effect is the same as the normal Hall effect in that the moving direction of moving charge (electrons) can be bent. In the normal Hall effect, the moving direction of charged particles moving in a magnetic field is bent by a Lorentz force. On the other hand, in the spin Hall effect, even in the absence of a magnetic field, the direction in which the spin moves is bent only by the movement of electrons (only the flow of current).

For example, when a current flows through the wiring 20, the first spin oriented in one direction and the second spin oriented in the opposite direction to the first spin are bent in a direction orthogonal to the current flowing direction by the spin Hall effect. For example, a first spin oriented in the −y direction is bent in the +z direction and a second spin oriented in the +y direction is bent in the −z direction.

In a non-magnetic material (a material that is not a ferromagnetic material), the number of electrons of the first spin S1 and the number of electrons of the second spin S2 generated by the spin Hall effect are equal. That is, the number of electrons of the first spin in the +z direction is equal to the number of electrons of the second spin in the −z direction. The first spin and the second spin flow in a direction in which the uneven distribution of spins is eliminated. In the movement of the first spin and the second spin in the z direction, the flow of the charges is offset by each other, so that the current amount becomes zero. This spin current without a current is particularly called a pure spin current.

If the electron flow of the first spin is represented by $J\uparrow$, the electron flow of the second spin is represented by $J\downarrow$, and the spin current is represented by $J_S$, this is defined as $J_S = J\uparrow - J\downarrow$. The spin current $J_S$ is generated in the z direction. The first spin is injected from the wiring 20 into the first ferromagnetic layer 1.

The wiring 20 contains a metal, an alloy, an intermetallic compound, a metal boride, a metal carbide, a metal silicide, or a metal phosphide having a function of generating a spin current by a spin Hall effect when a current flows.

The wiring 20 contains, for example, a non-magnetic heavy metal as a main element. The main element is an element having the highest proportion among the elements constituting the wiring 20. The wiring 20 contains, for example, at least one selected from a group consisting of W, Ta, Pt, Mo, Ir, Zr, Re, Y, Os, Ru, Rh, Pd, and Mn. Since these elements have d electrons or f electrons in the outermost shell, a strong spin-orbit interaction occurs and the amount of spins injected into the first ferromagnetic layer 1 increases.

The thermal conductivity of the wiring 20 at 0° C. is, for example, 200 W/mK or less. The wiring 20 has a higher resistance than the connection wiring Cw and serves as a heat source of the magnetoresistance effect element 100. When the heat generated in the wiring 20 propagates to the common wiring $Cm_j$, the capacitance and resistance of the common wiring $Cm_j$ change. Variations in the capacitance and resistance of the common wiring $Cm_j$ disturb the writing operation to the other magnetoresistance effect elements 100. As the thermal conductivity of the wiring 20 is lower, the amount of heat transmitted to the common wiring Cmj does not become too large.

The wiring 20 may contain a magnetic metal. The magnetic metal is a ferromagnetic or antiferromagnetic metal. A small amount of the magnetic metal contained in the non-magnetic material becomes a spin scattering factor. The small amount is, for example, 3% or less of the total molar ratio of the elements constituting the wiring 20. When the spins are scattered by the magnetic metal, the spin-orbit interaction is enhanced and the efficiency of generating the spin current with respect to the current is increased.

The wiring 20 may contain a topological insulator. The topological insulator is a substance in which the inside of a substance is an insulator or a high-resistance substance, but a spin-polarized metal state occurs on its surface. An internal magnetic field is generated in the topological insulator due to the spin-orbit interaction. The topological insulator develops a new topological phase due to the effect of the spin-orbit interaction even without an external magnetic field. The topological insulator can generate a pure spin current with high efficiency due to strong spin-orbit interaction and breaking of inversion symmetry at edges.

Preferred examples of the topological insulator include SnTe, $Bi_{1.5}Sb_{0.5}Te_{1.7}Se_{1.3}$, $TlBiSe_2$, $Bi_2Te_3$, $Bi_{1-x}Sb_x$, and $(Bi_{1-x}Sb_x)_2Te_3$. These topological insulators can generate a spin current with high efficiency.

The magnetoresistance effect element 100 is formed by a laminating step of each layer and a processing step of processing a part of each layer into a predetermined shape. The layers can be laminated by a sputtering method, a chemical vapor deposition (CVD) method, an electron beam evaporation method (EB evaporation method), an atomic laser deposition method, or the like. Processing of each layer can be performed using photolithography or the like.

Next, an operation of the magnetic recording array 200 will be described. Each of the writing operation and the reading operation of the magnetic recording array 200 will be described.

Figure 5:
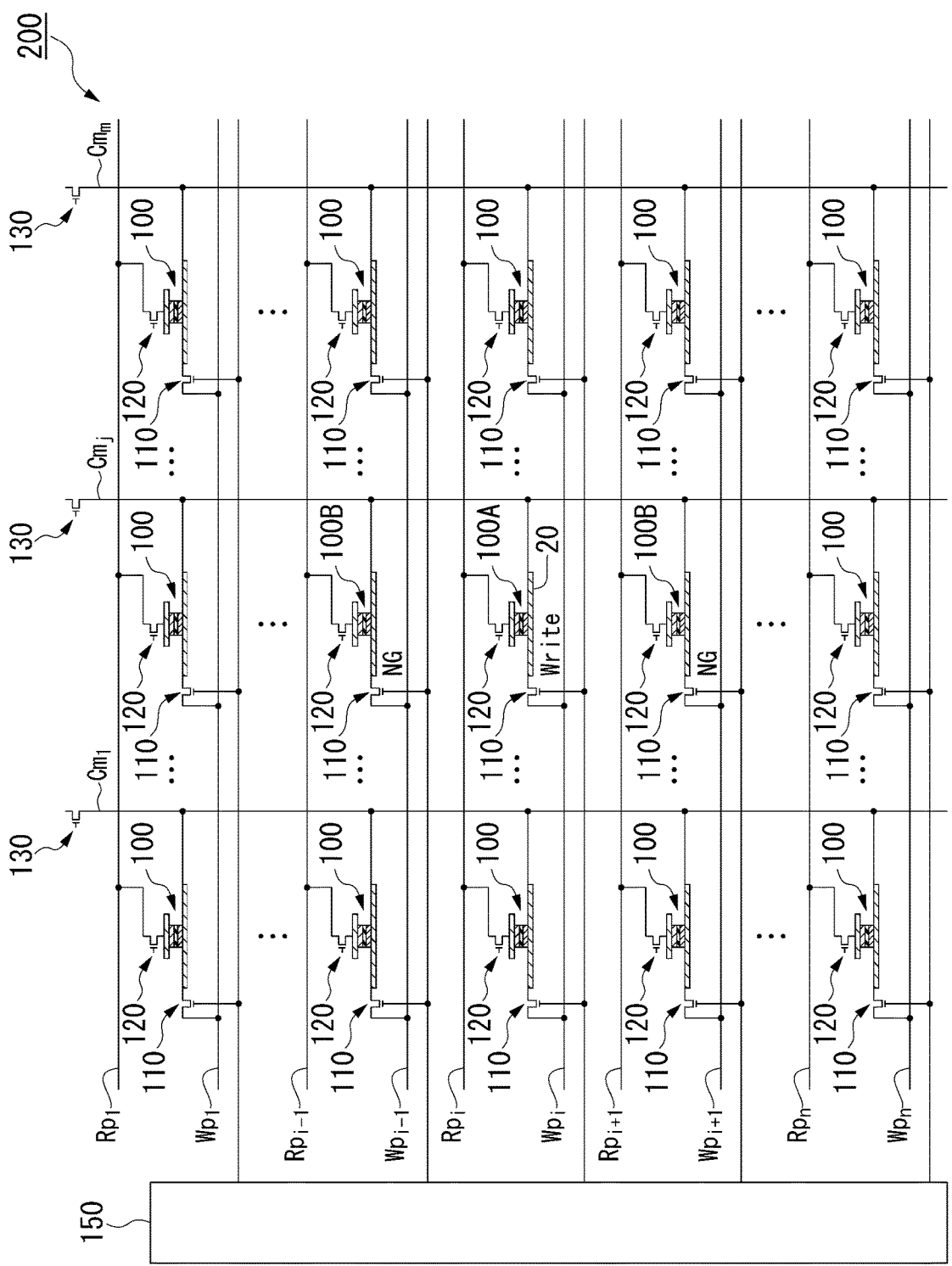
FIG. 5 is a schematic view showing an operation of the magnetic recording array according to the first embodiment.

The data writing operation will be described. The writing operation of the magnetic recording array 200 is controlled by the control unit 150. FIG. 5 is a schematic view showing a first example of the writing operation of the magnetic recording array 200.

First, an element for recording data is selected from the plurality of magnetoresistance effect elements. Hereinafter, the element for recording data is referred to as a first spin element 100A. When data is written to the first spin element 100A, the switching elements 110 and 130 connected to the first spin element 100A are turned on. When the switching elements 110 and 130 are turned on, a write current flows through the wiring 20. When the write current flows through the wiring 20, a spin Hall effect is generated so that spins are injected into the first ferromagnetic layer 1. The spins injected into the first ferromagnetic layer 1 change the orientation direction of the magnetization of the first ferromagnetic layer 1 by applying the spin orbit torque (SOT) to the magnetization of the first ferromagnetic layer 1. When the current flow direction is reversed, the direction of the spins injected into the first ferromagnetic layer 1 is reversed and hence the magnetization orientation direction can be freely controlled.

The resistance value of the laminated body 10 in the laminating direction is small when the magnetization of the first ferromagnetic layer 1 and the magnetization of the second ferromagnetic layer 2 are parallel and is large when the magnetization of the first ferromagnetic layer 1 and the magnetization of the second ferromagnetic layer 2 are antiparallel. Data is recorded in the magnetoresistance effect element 100 as the resistance value of the laminated body 10 in the laminating direction.

The magnetic recording array 200 often writes data continuously to the plurality of magnetoresistance effect elements 100. When the next writing operation is performed within 1000 nsec after performing the writing operation to one magnetoresistance effect element 100, this can be considered that data is continuously written.

When writing is performed continuously, the control unit 150 prohibits writing to at least an adjacent spin element 100B after a first spin element 100A. The spin element 100B is a spin element which is connected to the same common wiring $Cm_j$ as the first spin element 100A and is adjacent to the first spin element 100A. The adjacent state means the adjacent state in the path passing through the common wiring $Cm_j$. In addition, when the continuous writing is not performed, a writing operation to the first spin element 100A and the adjacent spin element 100B may be performed after the first spin element 100A. When the writing is performed twice for the first spin element 100A, it is preferable to leave an interval of 62 μsec or more between the first time and the second time.

When a write current is applied to the wiring 20 of the first spin element 100A, the wiring 20 generates heat. The heat generated in the wiring 20 propagates to the adjacent spin element 100B through the common wiring $Cm_j$. The heat deteriorates the stability of the magnetization of the first ferromagnetic layer 1 and the second ferromagnetic layer 2. For that reason, an applied current value required to write data to the spin element 100B changes. Further, when the common wiring $Cm_j$ generates heat, the capacitance and resistance of the common wiring $Cm_j$ change. When the capacitance and the resistance of the common wiring $Cm_j$ change, the applied current value required to write data changes.

When writing is performed continuously, if a writing operation to the spin element 100B next to the first spin element 100A is performed, the applied current value required to write data to the spin element 100B changes due to the heat generated when writing data to the first spin element 100A. When the applied current value changes, a writing error rate to the spin element 100B increases. In contrast, if writing to the spin element 100B is performed after heat generated in the first spin element 100A is sufficiently discharged, the applied current value required for writing becomes stable and hence an increase in the writing error rate can be suppressed.

Figure 6:
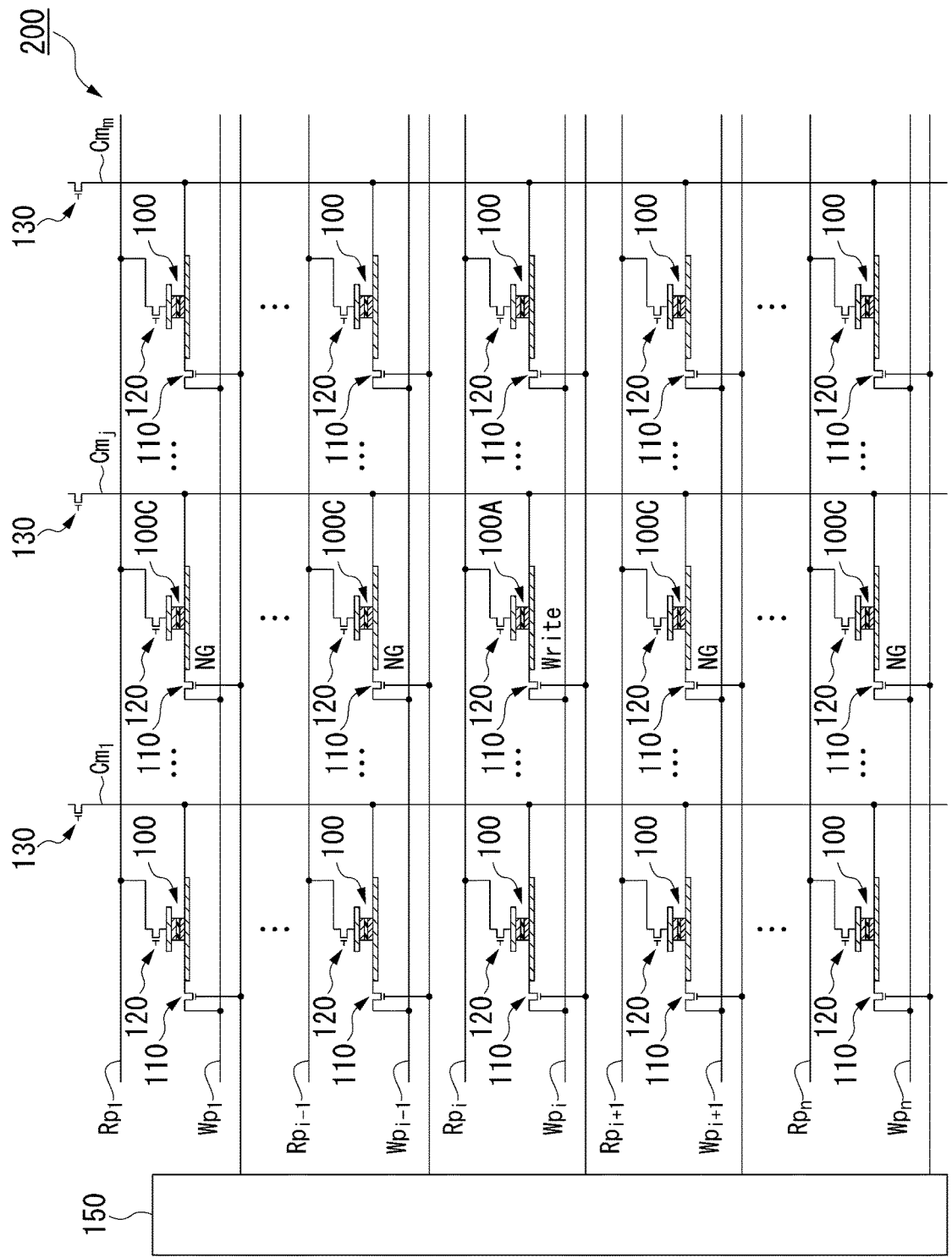
FIG. 6 is a schematic view showing an operation of the magnetic recording array according to the first embodiment.

Further, FIG. 6 is a schematic view showing a second example of the writing operation of the magnetic recording array 200. In the second example, when writing is performed continuously, the control unit 150 prohibits the writing to spin elements 100C connected to the same common wiring $Cm_j$ as the first spin element 100A.

Since the writing to the spin elements 100C connected to the same common wiring $Cm_j$ as the first spin element 100A is prohibited, a change in the applied current value due to a change in the capacitance and resistance of the common wiring $Cm_j$ can be suppressed. Further, heat hardly accumulates in the common wiring $Cm_j$ and deterioration of the common wiring $Cm_j$ can be suppressed.

The data reading operation will be described. The magnetoresistance effect element 100 for reading data is selected and the switching elements 120 and 130 connected to the element are turned on. When each switching element is set in this way, a read current flows in the laminating direction of the laminated body 10. The read current is smaller than the write current and hardly generates large heat. For that reason, a data reading procedure may not be controlled during reading. When the resistance value of the laminated body 10 in the laminating direction is different according to Ohm's law, the output voltage is different. For that reason, the data recorded in the magnetoresistance effect element 100 is read, for example, by reading a voltage in the laminating direction of the laminated body 10.

The magnetic recording array 200 according to the first embodiment can suppress the applied current value required for writing from becoming unstable by setting the fixed order of writing data by the control unit 150. When the write current value is stabilized, the writing error rate decreases.

Second Embodiment

Figure 7:
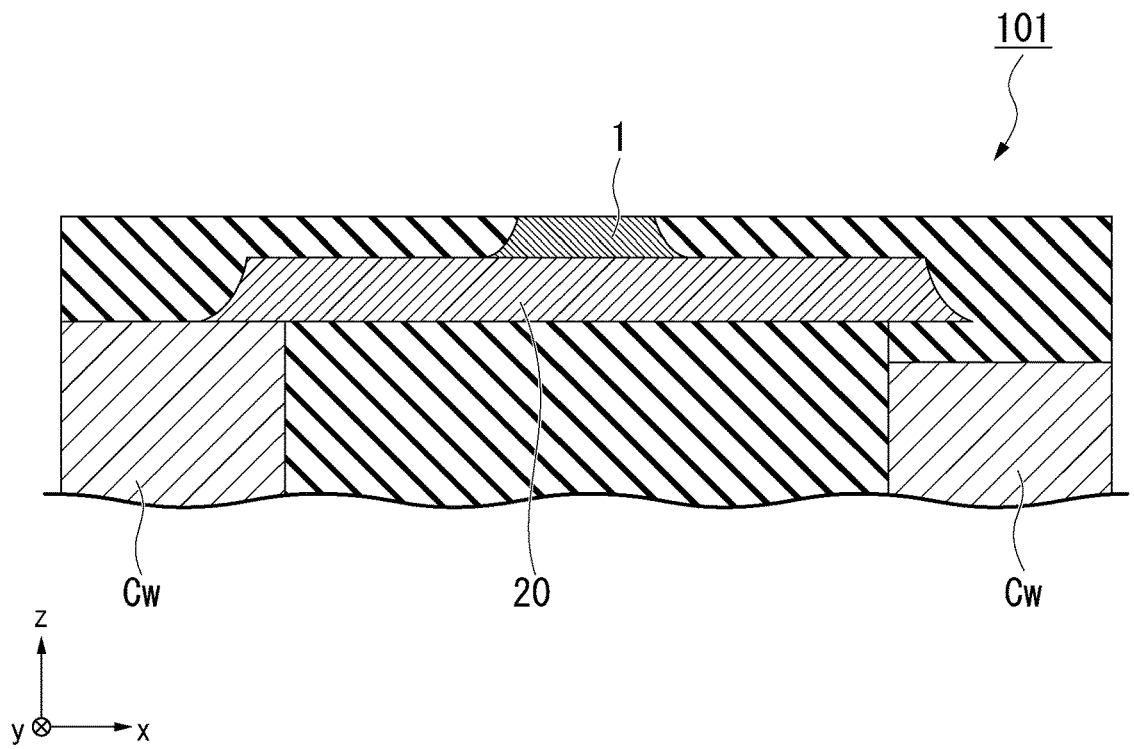
FIG. 7 is a cross-sectional view of a spin element according to a second embodiment.

FIG. 7 is a cross-sectional view of a magnetization rotational element 101 according to a second embodiment. FIG. 7 shows a cross-section in which the magnetization rotational element 101 is cut along an xz plane passing through the center of the width of the wiring 20 in the y direction. The magnetization rotational element 101 according to the second embodiment is different from the magnetoresistance effect element 100 according to the first embodiment in that the non-magnetic layer 3 and the second ferromagnetic layer 2 are not disposed. The other configurations of the second embodiment are the same as those of the magnetic recording array 200 according to the first embodiment and description thereof is omitted.

The magnetization rotational element 101 is an example of a spin element. For example, the magnetization rotational element 101 evaluates the light incident on the first ferromagnetic layer 1 and reflected. When the orientation direction of magnetization changes due to the magnetic Kerr effect, the deflection state of reflected light changes. The magnetization rotational element 101 can be used as, for example, an optical element such as a video display device using a difference in light deflection state.

In addition, the magnetization rotational element 101 can be used alone as an anisotropic magnetic sensor, an optical element using a magnetic Faraday effect, or the like.

The magnetic recording array according to the second embodiment is different from the magnetic recording array according to the first embodiment only in that the nonmagnetic layer 3 and second ferromagnetic layer 2 are removed, and has a control unit 150. For that reason, the magnetic recording array according to the second embodiment can obtain the same effect as that of the magnetic recording array 200 according to the first embodiment.

Third Embodiment

Figure 8:
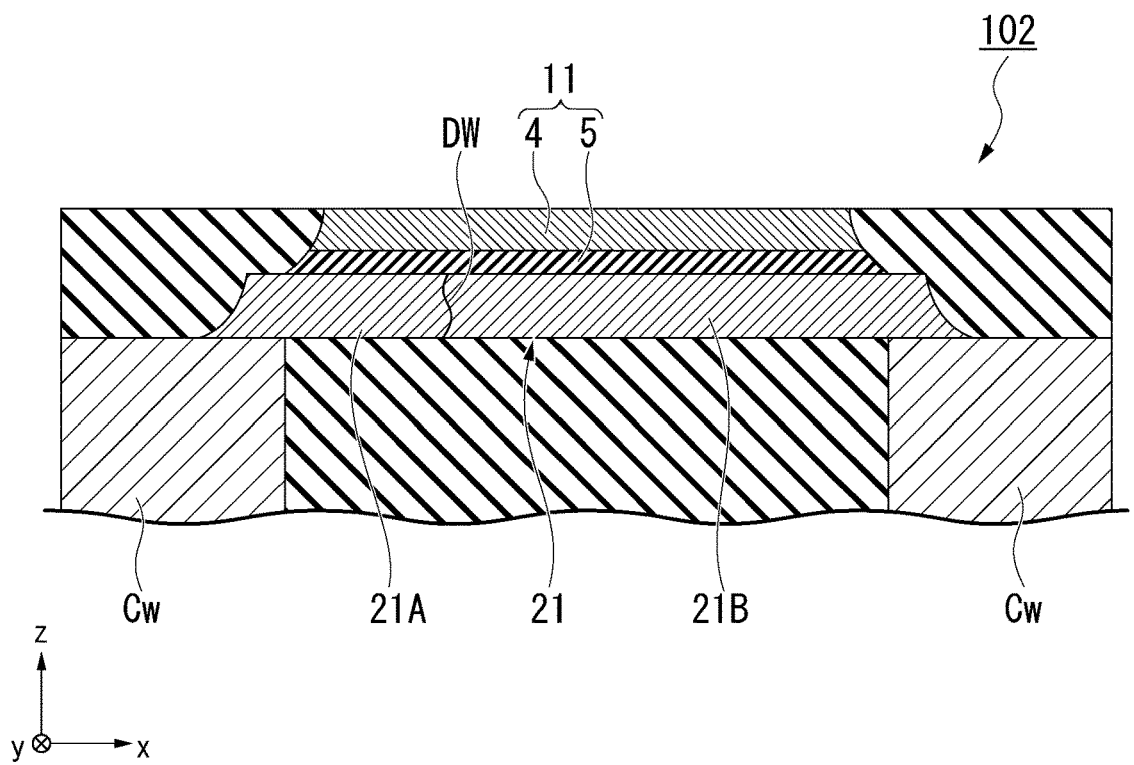
FIG. 8 is a cross-sectional view of a spin element according to a third embodiment.

FIG. 8 is a cross-sectional view of a magnetoresistance effect element 102 according to a third embodiment. FIG. 8 shows a cross-section in which the magnetoresistance effect element 102 is cut along an xz plane passing through the center of the width of the wiring 21 in the y direction. The magnetoresistance effect element 102 is different from the magnetoresistance effect element 100 in that the laminated body 11 includes the non-magnetic layer 5 and the first ferromagnetic layer 4 from a position near the wiring 21. The other configurations of the third embodiment are the same as those of the magnetic recording array 200 according to the first embodiment and description thereof is omitted.

The magnetoresistance effect element 102 includes the laminated body 11 and the wiring 21. The laminated body 11 includes the non-magnetic layer 5 and the first ferromagnetic layer 4 from a position near the wiring 21. The magnetoresistance effect element 102 is an element whose resistance value changes due to the movement of a magnetic domain wall DW and may be referred to as a magnetic domain wall moving element or a magnetic domain wall moving type magnetoresistive element.

The wiring 21 is a magnetic layer. The wiring 21 includes a ferromagnetic material. The wiring 21 is formed of, for example, a metal selected from a group consisting of Cr, Mn, Co, Fe, and Ni, an alloy containing one or more of these metals, and an alloy containing these metals and at least one or more elements of B, C and N. The wiring 21 contains, for example, any element of Fe, Co, and Ni. Fe, Co, and Ni have a thermal conductivity of 200 W/mK or less. The wiring 21 is, for example, Co—Fe, Co—Fe—B, or Ni—Fe.

The wiring 21 is a layer in which information can be magnetically recorded by a change in the internal magnetic state. The wiring 21 includes a first magnetic domain 21A and a second magnetic domain 21B therein. The magnetization of the first magnetic domain 21A and the magnetization of the second magnetic domain 21B are oriented, for example, in the opposite directions. A boundary between the first magnetic domain 21A and the second magnetic domain 21B is the magnetic domain wall DW. The wiring 21 can include the magnetic domain wall DW therein.

The magnetoresistance effect element 102 can record data in multiple values or continuously depending on the position of the magnetic domain wall DW of the wiring 21. The data recorded in the wiring 21 is read as a change in the resistance value of the magnetoresistance effect element 102 when a read current is applied.

The magnetic domain wall DW moves in such a manner that a write current flows in the x direction of the wiring 21 or an external magnetic field is applied. For example, since electrons move in the −x direction opposite to the current when a write current (for example, a current pulse) is applied to the wiring 21 in the +x direction, the magnetic domain wall DW moves in the −x direction. When current flows from the first magnetic domain 21A toward the second magnetic domain 21B, the electrons spin-polarized in the second magnetic domain 21B reverse the magnetization of the first magnetic domain 21A. The magnetic domain wall DW moves in the −x direction due to the magnetization reversal of the magnetization of the first magnetic domain 21A.

The first ferromagnetic layer 4 and the non-magnetic layer 5 are respectively the same as the first ferromagnetic layer 1 and the non-magnetic layer 3 according to the first embodiment.

The magnetic recording array according to the third embodiment can obtain the same effect as that of the magnetic recording array 200 according to the first embodiment.

Fourth Embodiment

Figure 9:
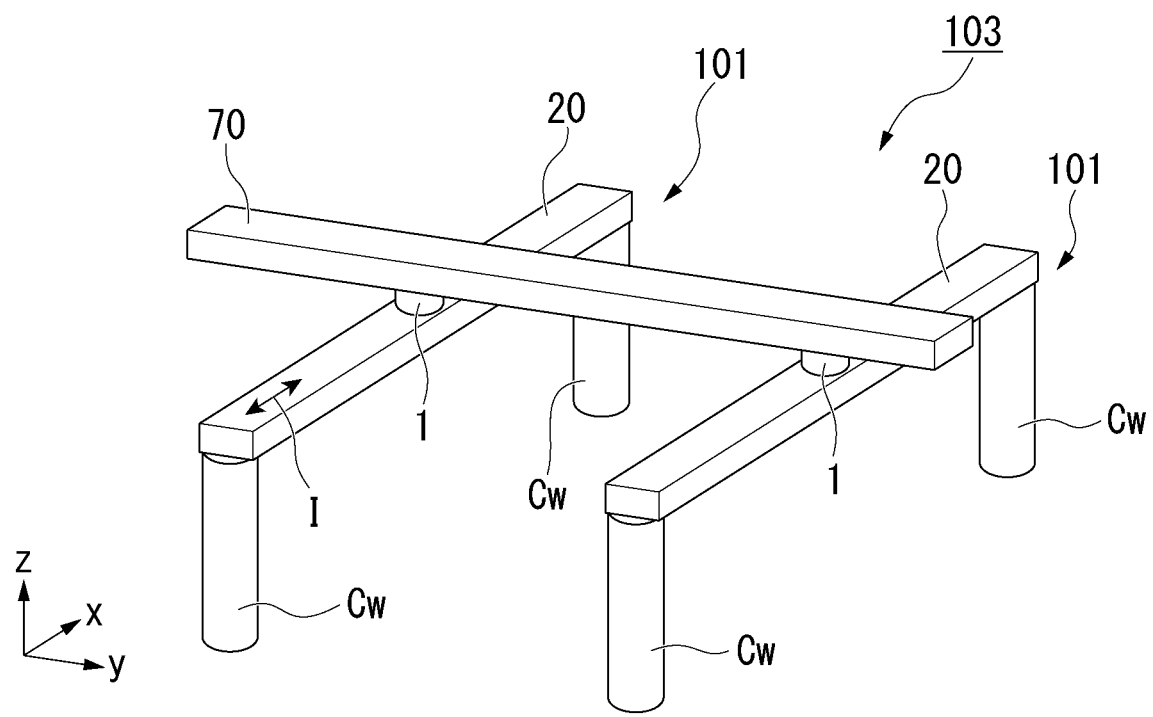
FIG. 9 is a perspective view of a reservoir element according to a fourth embodiment.

FIG. 9 is a perspective view of a reservoir element 103 according to a fourth embodiment. The reservoir element 103 includes the plurality of magnetization rotational elements 101 and a spin conduction layer 70 connecting the first ferromagnetic layers 1 of the plurality of magnetization rotational elements 101. The spin conduction layer 70 is formed as, for example, a non-magnetic conductor. The spin conduction layer 70 propagates the spin current entering from the first ferromagnetic layer 1.

The reservoir element is an element used in a reservoir computing which is one of neuromorphic elements. Neuromorphic elements are elements that imitate the human brain using neural networks. Neuromorphic elements are used, for example, as recognizers. For example, the recognizer recognizes and classifies the input image (image recognition).

The reservoir element 103 converts an input signal into another signal. Signals just interact with each other without leaning in the reservoir element 103. When input signals interact with each other, the input signal changes nonlinearly. That is, the input signal is replaced with another signal while retaining the original information. The input signals change over time by interacting with each other within the reservoir element 103. In the reservoir element 103, the first ferromagnetic layers 1 corresponding to a plurality of neurons are mutually connected. Therefore, for example, a signal output from a neuron at a certain time t may return to the original neuron at a certain time t+1. The neuron can perform processing based on signals at the time t and the time t+1 and can process information recursively.

The spin conduction layer 70 is formed of, for example, a metal or semiconductor. The metal used for the spin conduction layer 70 is, for example, a metal or an alloy containing any element selected from a group consisting of Cu, Ag, Al, Mg, and Zn. The semiconductor used for the spin conduction layer 70 is, for example, a simple substance or an alloy of any element selected from a group consisting of Si, Ge, GaAs, and C. For example, Si, Ge, a Si—Ge compound, GaAs, graphene, and the like are exemplary examples.

When a current I flows to the wiring 20, spins are injected into the first ferromagnetic layer 1 and spin orbit torque is applied to the magnetization of the first ferromagnetic layer 1. When a high-frequency current is applied to the wiring 20, the direction of spin injected into the first ferromagnetic layer 1 changes and the magnetization of the first ferromagnetic layer 1 is oscillated.

The spin current reaches from the first ferromagnetic layer 1 to the spin conduction layer 70. Since the magnetization of the first ferromagnetic layer 1 is oscillated, the spin current flowing through the spin conduction layer 70 is also oscillated in accordance with the magnetization. The spin accumulated in the boundary face between the first ferromagnetic layer 1 and the spin conduction layer 70 propagates in the spin conduction layer 70 as the spin current.

The spin currents generated by the magnetizations of the two first ferromagnetic layers 1 respectively merge and interfere in the spin conduction layer 70. The interference of the spin current affects the oscillation of the magnetization of each of the first ferromagnetic layers 1 and the oscillation of the magnetization of the two first ferromagnetic layers 1 resonates. The phases of the oscillations of the two magnetizations are synchronized or shifted by a half wavelength ($\pi$).

When the application of the current I to the wiring 20 is stopped, the oscillation of the magnetization of the first ferromagnetic layer 1 is stopped. The magnetization of the first ferromagnetic layer 1 after resonance becomes parallel or antiparallel. When the phases of two oscillations are synchronized, the two magnetization directions are aligned and parallel. When the phases of two oscillations are shifted by a half wavelength ($\pi$), the two magnetization directions are opposite and antiparallel.

When the magnetizations of two first ferromagnetic layers 1 are parallel, the resistance value of the reservoir element 103 becomes smaller than the case of the antiparallel magnetizations. For example, the reservoir element 103 outputs information of "1" when the resistance value of the reservoir element 103 is large (two magnetizations are antiparallel) and outputs information of "0" when the resistance value is small (two magnetizations are parallel).

The current I input to the wiring 20 includes various kinds of information. For example, the information includes the frequency of the current I, the current density, the current amount, and the like. On the other hand, the reservoir element 103 outputs information of "1" and "0" as the resistance value. That is, the reservoir element 103 according to the first embodiment converts information by converting the oscillation of the magnetization of the plurality of first ferromagnetic layers 1 into a spin current and causing interference in the spin conduction layer 70.

The reservoir element 103 according to the fourth embodiment includes the magnetic recording array 200 according to the first embodiment and can obtain the same effect as that of the first embodiment.

So far, the preferred embodiments of the present invention have been described on the basis of the first to fourth embodiments, but the present invention is not limited to these embodiments. For example, a characteristic configuration in each embodiment may be applied to another embodiment.

REFERENCE SIGNS LIST 1, 4 First ferromagnetic layer
2 Second ferromagnetic layer
3, 5 Non-magnetic layer
10, 11 Laminated body
20, 21 Wiring
21A First magnetic domain
21B Second magnetic domain
70 Spin conduction layer
90, 91, 92 Insulating layer
100, 102 Magnetoresistance effect element
100A First spin element
100B, 100C Spin element
101 Magnetization rotational element
103 Reservoir element
110, 120, 130 Switching element
150 Control unit
200 Magnetic recording array
$Cm_1$ to $Cm_m$ Common wiring
$Rp_1$ to $Rp_n$ Read wiring
$Wp_1$ to $Wp_n$ Write wiring

What is claimed is:

1. A magnetic recording array comprising:
a plurality of spin elements each of which includes a wiring and a laminated body having a first ferromagnetic layer laminated on the wiring and which are arranged in a matrix;
a plurality of write wirings which are respectively connected to first ends of the wirings of the plurality of spin elements;
a plurality of read wirings which are respectively connected to the laminated bodies of the plurality of spin elements;
a plurality of common wirings which are respectively connected to second ends of the wirings of the spin elements belonging to the same column; and
a control unit which is configured to control a write current flowing through the wiring of each spin element,
wherein when data writing is performed continuously, the control unit is configured to prohibit writing to at least a spin element connected to the same common wiring as a first spin element and adjacent to the first spin element after the first spin element to which the write current is applied.

2. The magnetic recording array according to claim 1, wherein when data writing is performed continuously, the control unit prohibits writing to the spin elements connected to the same common wiring as the first spin element after the first spin element to which the write current is applied.

3. The magnetic recording array according to claim 1, wherein the wiring has a thermal conductivity of 200 W/mK or less at 0° C.

4. The magnetic recording array according to claim 2, wherein the wiring has a thermal conductivity of 200 W/mK or less at 0° C.

5. The magnetic recording array according to claim 1, wherein the laminated body includes the first ferromagnetic layer, and
wherein the wiring is any one of a metal, an alloy, an intermetallic compound, a metal boride, a metal carbide, a metal silicide, and a metal phosphide having a function of generating a spin current by a spin Hall effect when a current flows.

6. The magnetic recording array according to claim 5, wherein the wiring contains at least one selected from a group consisting of W, Ta, Pt, Mo, Ir, Zr, Re, Y, Os, Ru, Rh, Pd, and Mn.

7. The magnetic recording array according to claim 1, wherein the laminated body includes the first ferromagnetic layer, a non-magnetic layer, and a second ferromagnetic layer from a position near the wiring, and
wherein the wiring is any one of a metal, an alloy, an intermetallic compound, a metal boride, a metal carbide, a metal silicide, and a metal phosphide having a function of generating a spin current by a spin Hall effect when a current flows.

8. The magnetic recording array according to claim 7, wherein the wiring contains at least one selected from a group consisting of W, Ta, Pt, Mo, Ir, Zr, Re, Y, Os, Ru, Rh, Pd, and Mn.

9. The magnetic recording array according to claim 1, wherein the laminated body includes a non-magnetic layer and the first ferromagnetic layer from a position near the wiring, and
wherein the wiring is a ferromagnetic layer having a magnetic domain wall provided therein.

10. A reservoir element comprising:
the magnetic recording array according to claim 5; and
a spin conduction layer which is configured to connect the first ferromagnetic layers of the plurality of spin elements.

\* \* \* \* \*